(12) United States Patent
Kizilyalli et al.

(10) Patent No.: US 9,484,470 B2
(45) Date of Patent: Nov. 1, 2016

(54) METHOD OF FABRICATING A GAN P-I-N DIODE USING IMPLANTATION

(71) Applicant: Avogy, Inc., San Jose, CA (US)

(72) Inventors: Isik C. Kizilyalli, San Francisco, CA (US); Hui Nie, Cupertino, CA (US); Andrew P. Edwards, San Jose, CA (US); Richard J. Brown, Los Gatos, CA (US); Donald R. Disney, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 14/834,306

(22) Filed: Aug. 24, 2015

(65) Prior Publication Data

US 2015/0364612 A1   Dec. 17, 2015

Related U.S. Application Data

(63) Continuation of application No. 14/454,524, filed on Aug. 7, 2014, which is a continuation of application No. 13/335,329, filed on Dec. 22, 2011, now Pat. No. 8,822,311.

(51) Int. Cl.
*H01L 29/868* (2006.01)
*H01L 29/06* (2006.01)
(Continued)

(52) U.S. Cl.
CPC .......... *H01L 29/868* (2013.01); *H01L 29/0615* (2013.01); *H01L 29/0649* (2013.01);
(Continued)

(58) Field of Classification Search
CPC ........... H01L 29/0615; H01L 29/0649; H01L 29/66204; H01L 29/6631; H01L 29/66212; H01L 29/868; H01L 29/2003; H01L 29/66924

USPC ............... 257/76, 77, 472, 488, E29.089, 257/E29.104, E29.336, E33.051, E33.061, 257/E21.09; 438/429, 478, 576
See application file for complete search history.

(56) References Cited

U.S. PATENT DOCUMENTS 8,592,298 B2   11/2013   Romano et al.
8,643,134 B2   2/2014   Raj et al.
(Continued)

FOREIGN PATENT DOCUMENTS

CN   102084487 A   6/2011
CN   102187433 A   9/2011
(Continued)

OTHER PUBLICATIONS

CN201280068139.9, Office Action, Apr. 27, 2016, 8 pages.
(Continued)

*Primary Examiner* — Dao H Nguyen
(74) *Attorney, Agent, or Firm* — Kilpatrick Townsend & Stockton LLP

(57) ABSTRACT

A III-nitride semiconductor device includes an active region for supporting current flow during forward-biased operation of the III-nitride semiconductor device. The active region includes a first III-nitride epitaxial material having a first conductivity type, and a second III-nitride epitaxial material having a second conductivity type. The III-nitride semiconductor device further includes an edge-termination region physically adjacent to the active region and including an implanted region comprising a portion of the first III-nitride epitaxial material. The implanted region of the first III-nitride epitaxial material has a reduced electrical conductivity in relation to portions of the first III-nitride epitaxial material adjacent to the implanted region

20 Claims, 10 Drawing Sheets

(51) Int. Cl.
  *H01L 21/20* (2006.01)
  *H01L 29/66* (2006.01)
  *H01L 29/20* (2006.01)

(52) U.S. Cl.
  CPC ..... *H01L29/2003* (2013.01); *H01L 29/66204* (2013.01); *H01L 29/6631* (2013.01); *H01L 29/66212* (2013.01); *H01L 29/66924* (2013.01)

(56) References Cited

U.S. PATENT DOCUMENTS

| | | |
|---|---|---|
| 8,749,015 B2 | 6/2014 | Disney et al. |
| 2003/0006453 A1 | 1/2003 | Liang et al. |
| 2003/0045035 A1 | 3/2003 | Shenai et al. |
| 2004/0124435 A1 | 7/2004 | D'Evelyn et al. |
| 2009/0085166 A1 | 4/2009 | Iwamuro et al. |
| 2010/0032685 A1* | 2/2010 | Zhang ................ H01L 29/0615 257/77 |
| 2010/0301351 A1 | 12/2010 | Flynn et al. |
| 2011/0198693 A1 | 8/2011 | Shiomi et al. |
| 2013/0087835 A1 | 4/2013 | Edwards et al. |
| 2013/0126885 A1* | 5/2013 | Disney ................ H01L 21/2654 257/76 |
| 2014/0346527 A1* | 11/2014 | Kizilyalli ............. H01L 29/868 257/76 |

FOREIGN PATENT DOCUMENTS

| | | |
|---|---|---|
| CN | 104011865 A | 8/2014 |
| CN | 104094417 A | 10/2014 |
| WO | 2013096013 A1 | 6/2013 |

OTHER PUBLICATIONS

CN201280068139.9, Office Action, Sep. 25, 2015, 8 pages.
PCT/US2012/068972, International Search Report and Written Opinion for PCT/US2012/068972, PCT/US2012/068972, Feb. 20, 2013, 12 Pages.

* cited by examiner

METHOD OF FABRICATING A GAN P-I-N DIODE USING IMPLANTATION

CROSS-REFERENCES TO RELATED APPLICATIONS

This application is a continuation of U.S. patent application Ser. No. 14/454,524, filed on Aug. 7, 2014, the disclosure of which is incorporated by reference herein in its entirety for all purposes.

Additionally, following regular U.S. patent applications are incorporated by reference into this application for all purposes:

application Ser. No. 13/270,606, filed Oct. 11, 2011, entitled "METHOD AND SYSTEM FOR FLOATING GUARD RINGS IN GAN MATERIALS";

application Ser. No. 13/300,028, filed Nov. 18, 2011, entitled "GAN-BASED SCHOTTKY BARRIER DIODE WITH FIELD PLATE";

application Ser. No. 13/299,254, filed Nov. 17, 2011, entitled "METHOD AND SYSTEM FOR FABRICATING FLOATING GUARD RINGS IN GAN MATERIALS."

application Ser. No. 13/335,329, filed Dec. 22, 2011, entitled "METHOD OF FABRICATING A GAN P-I-N DIODE USING IMPLANTATION"; and application Ser. No. 13/335,355, filed Dec. 22, 2011, entitled "FABRICATION OF FLOATING GUARD RINGS USING SELECTIVE REGROWTH".

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to techniques for providing a P-i-N diode using III-nitride semiconductor materials with implanted region(s) to provide edge termination. Merely by way of example, the invention has been applied to methods and systems for manufacturing P-i-N diodes for high-voltage GaN-based devices. The methods and techniques can be applied to a variety of compound semiconductor systems such as vertical junction field-effect transistors (JFETs), thyristors, Schottky barrier diodes, PN diodes, bipolar transistors, and other devices.

According to one embodiment, a method for fabricating a III-nitride semiconductor device is provided. The method includes providing a III-nitride substrate of a first conductivity type and characterized by a first dopant concentration, and forming a first III-nitride epitaxial layer of the first conductivity type coupled to the III-nitride substrate. The first III-nitride epitaxial layer is characterized by a second dopant concentration less than the first dopant concentration. The method further includes forming a second III-nitride epitaxial layer of a second conductivity type coupled to the first III-nitride epitaxial layer, removing a portion of the second III-nitride epitaxial layer to expose a portion of the first III-nitride epitaxial layer, and implanting ions into an implanted region of the exposed portion of the first III-nitride epitaxial layer. The exposed portion of the first III-nitride epitaxial layer is adjacent to a remaining portion of the second III-nitride epitaxial layer. The method also includes forming a first metal structure coupled to the remaining portion of the second III-nitride epitaxial layer, and forming a second metal structure coupled to the III-nitride substrate. A charge density in the implanted region is substantially lower than a charge density in the first III-nitride epitaxial layer.

According to another embodiment, a method for fabricating a III-nitride semiconductor device is provided. The method includes providing a III-nitride substrate of a first conductivity type and characterized by a first dopant concentration, and forming a first III-nitride epitaxial layer of the first conductivity type coupled to the III-nitride substrate. The first III-nitride epitaxial layer is characterized by a second dopant concentration less than the first dopant concentration. The method also includes forming a second III-nitride epitaxial layer of a second conductivity type coupled to the first III-nitride epitaxial layer, and implanting ions into an implanted region comprising a first portion of the first III-nitride epitaxial layer and a first portion of the second III-nitride epitaxial layer. The method further includes forming a first metal structure coupled to a second portion of the second III-nitride epitaxial layer, and forming a second metal structure coupled to the III-nitride substrate.

According to yet another embodiment, a III-nitride semiconductor device is provided. The III-nitride semiconductor device includes an active region for supporting current flow during forward-biased operation of the III-nitride semiconductor device. The active region includes a first III-nitride epitaxial material having a first conductivity type, and a second III-nitride epitaxial material having a second conductivity type. The III-nitride semiconductor device further includes an edge-termination region physically adjacent to the active region and including an implanted region comprising a portion of the first III-nitride epitaxial material. The implanted region of the first III-nitride epitaxial material has a reduced electrical conductivity in relation to portions of the first III-nitride epitaxial material adjacent to the implanted region.

Numerous benefits are achieved by way of the present invention over conventional techniques. For example, some embodiments of the present invention reduce the electric field crowding at the periphery of vertical power devices, which can result in devices capable of operating at higher voltages than conventional devices. Additionally, some embodiments of the present invention increase the critical electric field at the periphery of vertical power devices, resulting in even higher operating voltages. Moreover, the present invention provides self-aligned edge termination regions that are simpler and cheaper to fabricate compared to prior-art devices.

Another advantage provided by embodiments of the present invention over conventional devices is based on the superior material properties of GaN-based materials. Embodiments of the present invention provide homoepitaxial GaN layers on bulk GaN substrates that are imbued with superior properties to other materials used for power electronic devices. High electron mobility, $\mu$, is associated with a given background doping level, N, which results in low resistivity, $\rho$, since $\rho = 1/q\mu N$.

The ability to obtain regions that can support high voltage with low resistance compared to similar device structures in other materials allows embodiments of the present invention to provide resistance properties and voltage capability of conventional devices, while using significantly less area for the GaN device. Capacitance, C, scales with area, approximated as C=∈A/t, so the smaller device will have less terminal-to-terminal capacitance. Lower capacitance leads to faster switching and less switching power loss.

These and other embodiments of the invention along with many of its advantages and features are described in more detail in conjunction with the text below and attached figures.

Figure 1A:
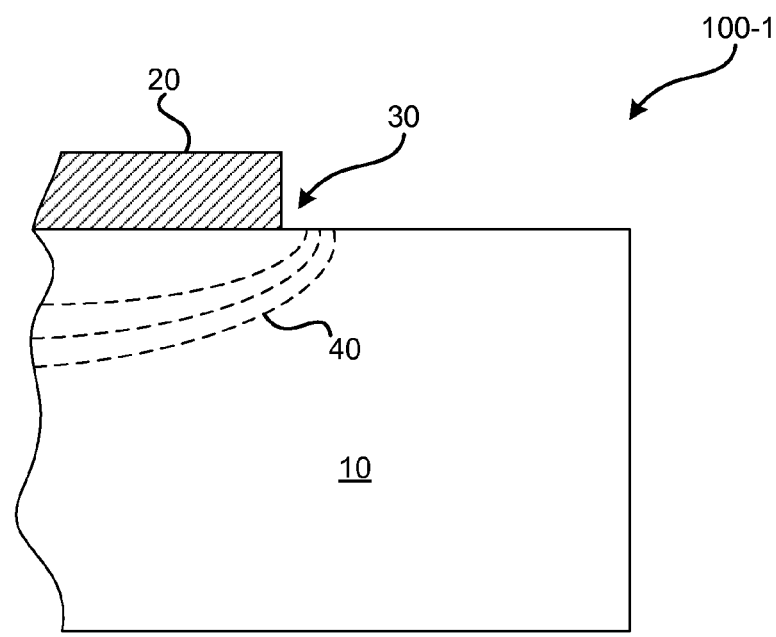
FIGS. 1A-1B are simplified cross-sectional diagrams of a portion of a P-i-N diode without and with an implanted region for edge termination, respectively, according to certain embodiments of the present invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

The present invention relates generally to electronic devices. More specifically, the present invention relates to techniques for providing a P-i-N diode using III-nitride semiconductor materials with implanted region(s) to provide edge termination. Merely by way of example, the invention has been applied to methods and systems for manufacturing P-i-N diodes for high-voltage GaN-based devices. The methods and techniques can be applied to a variety of compound semiconductor systems such as vertical junction field-effect transistors (JFETs), thyristors, Schottky barrier diodes, PN diodes, bipolar transistors, and other devices.

GaN-based electronic and optoelectronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, μ, is higher than competing materials for a given background doping level, N. This provides low resistivity, ρ, because resistivity is inversely proportional to electron mobility, as provided by equation (1):

$$\rho = \frac{1}{q\mu N}, \qquad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \qquad (2)$$

where A is the cross-sectional area of the channel or current path.

In general, there is a tradeoff between the physical dimension needed to support high voltage in a device's off state and the ability to pass current through the same region with low resistance in the device's on state. A P-i-N diode is formed by a P-type semiconductor region in contact with an "intrinsic" semiconductor region in contact with an N-type semiconductor region. The "intrinsic" region may be truly intrinsic, i.e. not intentionally doped with P-type or N-type dopants, or it may simply be much more lightly doped with either P-type or N-type dopants compared to the N-type and P-type regions on either side of the intrinsic region. Such a diode may also be commonly referred to simply as a PN diode. It is well within the scope of this invention to substitute a lightly-doped drift region for the intrinsic region, and substitute a PN diode for the P-i-N diode.

As described herein, P-i-N diodes are capable of exceeding the majority carrier device figures of merit due to minority carrier injection into the intrinsic region in the on state. Therefore, the drift layer doping level can be made lower for a given thickness while still obtaining low resistance in the on state. The resistance becomes dependent on the carrier injection levels rather than the carriers provided by doping. The electric field provide will flatten, or be spread out across the drift region, as the doping is lowered and high breakdown can be maintained with a thinner drift layer. GaN layers grown on bulk GaN substrates have low defect density compared to layers grown on mismatched substrates and consequently can have large minority carrier lifetime in the intrinsic region compared to non-bulk GaN, enhancing the carrier injection effect for wider base region. The low defect density will also give rise to superior thermal conductivity. Despite these advantages, however, P-i-N diodes used in high-voltage applications can still suffer adverse effects due to edge field crowding. When properly employed, edge termination allows a semiconductor device to break down uniformly at its main junction rather than uncontrollably at its edge. According to embodiments of the present invention, edge termination structures are formed to alleviate edge field crowding by creating implanted regions at the edge of an active region of a GaN-based P-i-N diode, and similar devices.

Figure 1B:
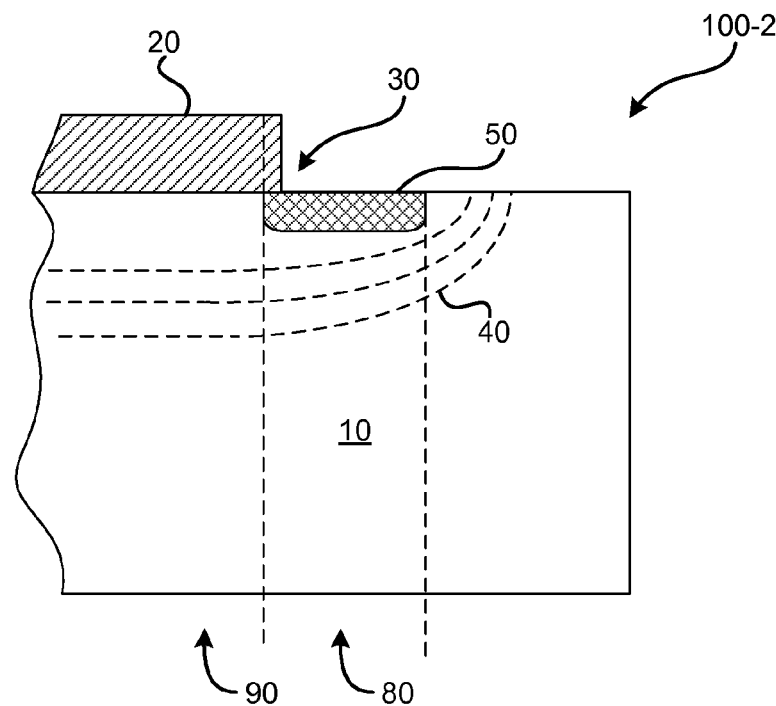

FIGS. 1A-1B are simplified cross-sectional diagrams of a portion of P-i-N diodes 100, illustrating how the implanted regions discussed herein can provide edge termination to improve the performance of the P-i-N diode, as well as other semiconductor devices. These figures are included for illustrative purposes and are not intended to show all components of an operational P-i-N diode. Moreover, a person of ordinary skill in the art will recognize a variety of alternatives, alterations, and modifications of the features shown in the figures.

FIG. 1A illustrates a first P-i-N diode 100-1 in which a junction is created between a p+ epitaxial layer 20 and an intrinsic region 10, which can be an n− epitaxial layer. Because the P-i-N diode 100-1 has no termination structures, its performance is reduced. Specifically, the electric field 40 (the magnitude of the electric field is represented by the spacing between adjacent equipotential lines in FIG. 1A), is crowded near the edge 30 of the P-i junction of the P-i-N diode 100-1, causing breakdown at a voltage that can be much less than the parallel plane breakdown voltage for the P-i-N diode 100-1. This phenomenon can be especially detrimental to the operation of high-voltage P-i-N diodes and other semiconductor devices.

FIG. 1B illustrates how an implanted region 50 can be used to alleviate field crowding near the edge 30 of a second P-i-N diode 100-2, according to one embodiment of the present invention. An edge-termination region 80 is provided physically adjacent to an active region 90 configured to support current flow during forward-biased operation of the P-i-N diode 100-2. The implanted region 50 can be electrically insulating and have relatively little or no electrical charge (free holes, free electrons, electrically active ionized donor or acceptor atoms). Because the implanted region 50 is located at the edge 30 the active region 90 of the P-i-N diode 100-2, it pushes the depletion region farther out beyond the edge 30 of the P-i-N diode 100-2, thus spreading out the potential contour lines and reducing the electric field 40. In this manner, the edge-termination region 80 helps enable the P-i-N diode 100-2 to operate at a breakdown voltage much closer to its parallel plane breakdown voltage. Furthermore, the implanted region 50 may be subject to lateral spread such that a portion of the implanted region 50 extends under p+ epitaxial layer 20, between the p+ epitaxial layer 20 and the intrinsic region 10, which can further enhance the effectiveness of the edge termination, resulting in better control of the electric field 40 and better performance of the P-i-N diode 100-2. The critical electric field (i.e. magnitude of electric field at which avalanche breakdown occurs) may also be significantly higher within implanted region 50 in comparison to intrinsic region 10, which may further increase the breakdown voltage of P-i-N diode 100-2.

Methods for the formation of isolation implanted regions in structures formed from GaN and related alloys and heterostructures can differ from those used in other semiconductors, such as Si and SiC. Furthermore, structures that would benefit from the incorporation of the implanted regions provided herein have rarely been manufactured using GaN and related alloys and heterostructures. For example, lasers can utilize structures formed from GaN-based materials, but because there is no reverse bias in such structures, there has been little need for the incorporation of edge-termination structures such as the implanted regions disclosed herein. On the other hand, now that various structures, including high-voltage P-i-N diodes and other semiconductor devices, can be formed on GaN and related alloys and heterostructures, the implanted regions provided herein can play a valuable role in ensuring the structures do not suffer from the adverse effects of edge field crowding.

Figure 2:
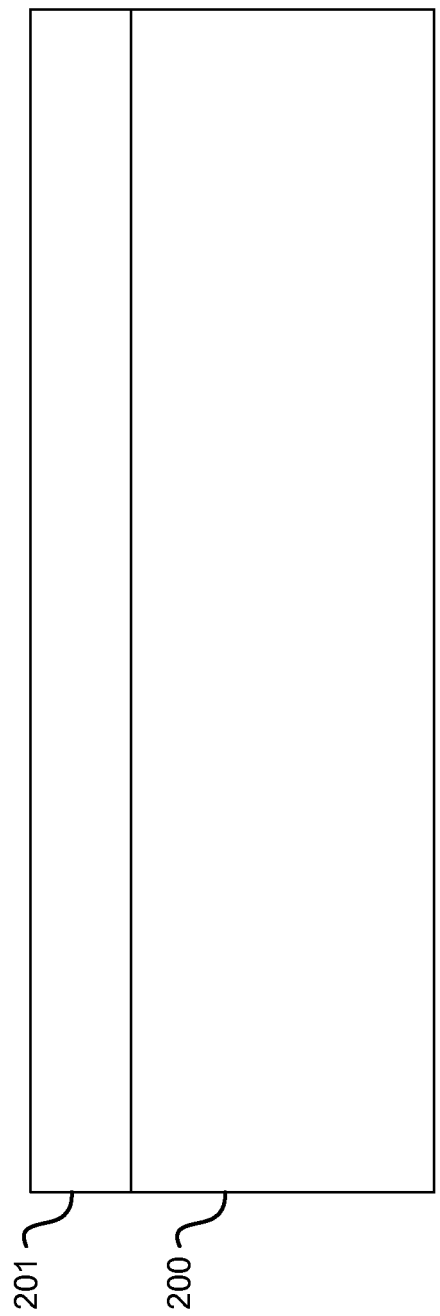
FIGS. 2-7 are simplified cross-sectional diagrams illustrating a process for creating a P-i-N diode in GaN with implanted regions for edge termination according to an embodiment of the present invention.

FIGS. 2-7 are simplified cross-sectional diagrams illustrating a process for creating a P-i-N diode in GaN with an implanted region(s) according to an embodiment of the present invention. Similar techniques may be applied provide edge termination for semiconductor devices other than a P-i-N diode. Referring to FIG. 2, a first GaN epitaxial layer 201 is formed on a GaN substrate 200 having the same conductivity type. The GaN substrate 200 can be a pseudo-bulk or bulk GaN material on which the GaN epitaxial layer 201 is grown. Dopant concentrations (e.g., doping density) of the GaN substrate 200 can vary, depending on desired functionality. For example, a GaN substrate 200 can have an n+ conductivity type, with dopant concentrations ranging from $1\times10^{17}$ cm$^{-3}$ to $1\times10^{19}$ cm$^{-3}$. Although the GaN substrate 200 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 201 can also vary, depending on desired functionality. The first GaN epitaxial layer 201 can serve as an intrinsic region for the P-i-N diode, being substantially undoped or unintentionally doped, or may serve as the drift region of a PN diode and therefore can be a relatively low-doped material. For example, the first GaN epitaxial layer 201 can have an n− conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the intrinsic region.

The thickness of the first GaN epitaxial layer 201 can also vary substantially, depending on the desired functionality. As discussed above, homoepitaxial growth can enable the first GaN epitaxial layer 201 to be grown far thicker than layers formed using conventional methods. In general, in some embodiments, thicknesses can vary between 0.5 μm and 100 μm, for example. Resulting parallel plane breakdown voltages for the P-i-N diode can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, selenium, tellurium, sulfur, or the like. P-type dopants can include magnesium, beryllium, calcium zinc, or the like.

Figure 3:
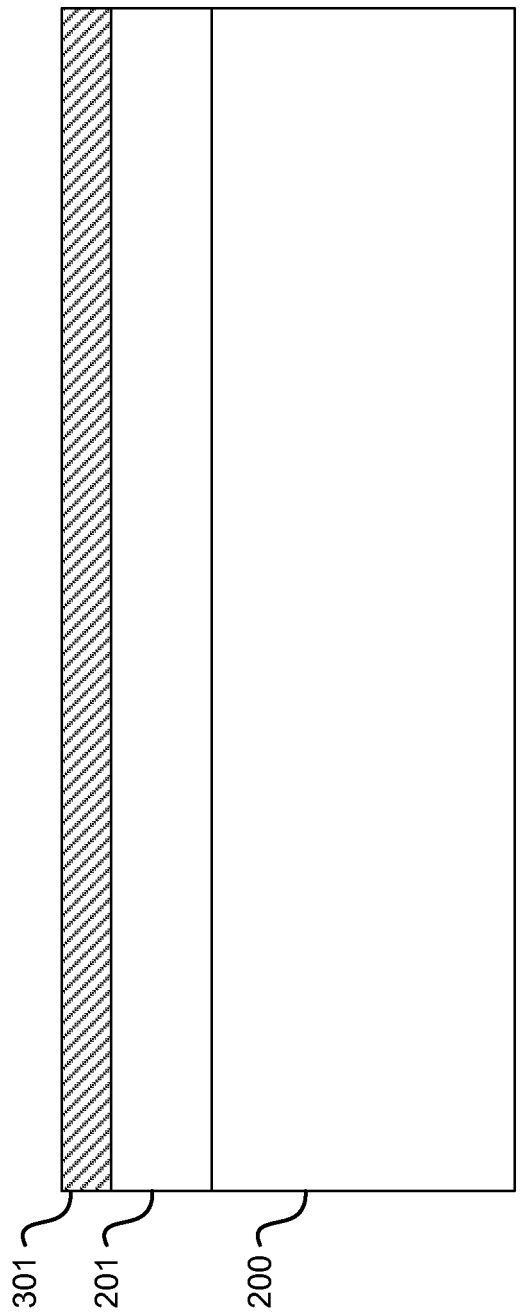

FIG. 3 illustrates the formation of a second GaN epitaxial layer 301 coupled to first GaN epitaxial layer 201. The second GaN epitaxial layer 301 may have a conductivity type opposite the conductivity type of the GaN substrate 200. For instance, if the GaN substrate 200 is formed from an n-type GaN material, the second GaN epitaxial layer 301 will be formed from a p-type GaN material, and vice versa. The second GaN epitaxial layer 301 can be used to form, for example, the p-type region of the P-i-N diode or PN diode.

The thickness of the second GaN epitaxial layer 301 can vary, depending on the process used to form the layer and the desired functionality of the P-i-N diode. In some embodiments, the thickness of the second GaN epitaxial layer 301 may be between 0.1 μm and 5 μm.

The second GaN epitaxial layer 301 can be highly doped, for example in a range from about $5\times10^{17}$ cm$^{-3}$ to about $1\times10^{19}$ cm$^{-3}$. Additionally, as with other epitaxial layers, the dopant concentration of the second GaN epitaxial layer 301 can be uniform or non-uniform as a function of thickness. In some embodiments, the dopant concentration increases with thickness, such that the dopant concentration is relatively low near the first GaN epitaxial layer 201 and increases as the distance from the first GaN epitaxial layer 201 increases. Such embodiments provide higher dopant concentrations at the top of the second GaN epitaxial layer 301 where metal contacts can be subsequently formed. Other embodiments utilize heavily doped contact layers (not shown) to form contacts.

One method of forming the second GaN epitaxial layer 301, and other layers described herein, can be through a regrowth process that uses an in-situ etch and diffusion preparation processes. These preparation processes are described more fully in U.S. patent application Ser. No. 13/198,666, filed on Aug. 4, 2011, the disclosure of which is hereby incorporated by reference in its entirety.

Figure 4:
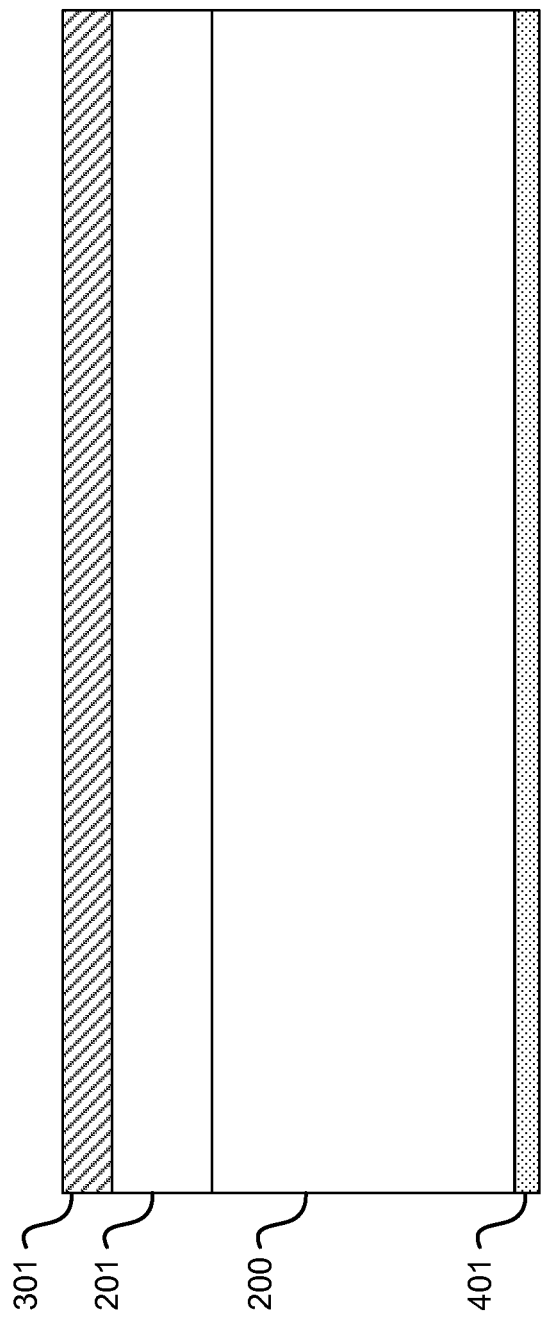

FIG. 4 illustrates the formation of a metal structure 401 below the GaN substrate 200. The metal structure 401 can be one or more layers of metal that serve as an Ohmic contact for the cathode of the P-i-N diode. For example, the metal structure 401 can comprise a titanium-aluminum (Ti/Al) metal. Other metals and/or alloys can be used including, but not limited to, aluminum, nickel, gold, combinations thereof, or the like. In some embodiments, an outermost metal of the metal structure 401 can include gold, tantalum, tungsten, palladium, silver, tin, aluminum, combinations thereof, and the like. The metal structure 401 can be formed using any of a variety of methods such as sputtering, evaporation, or the like. After the metal structure 401 is formed, an optional heat treatment may be performed to improve the characteristics of the metal and/or the contact between the metal and the GaN substrate 200. For example, a Rapid Thermal Anneal (RTA) may be performed with a temperature in the range of 300° C. to 900° C. for a duration of one to ten minutes. In some embodiments, the ambient environment during the RTA may include nitrogen, hydrogen, oxygen, or a combination of these gases.

Figure 5:
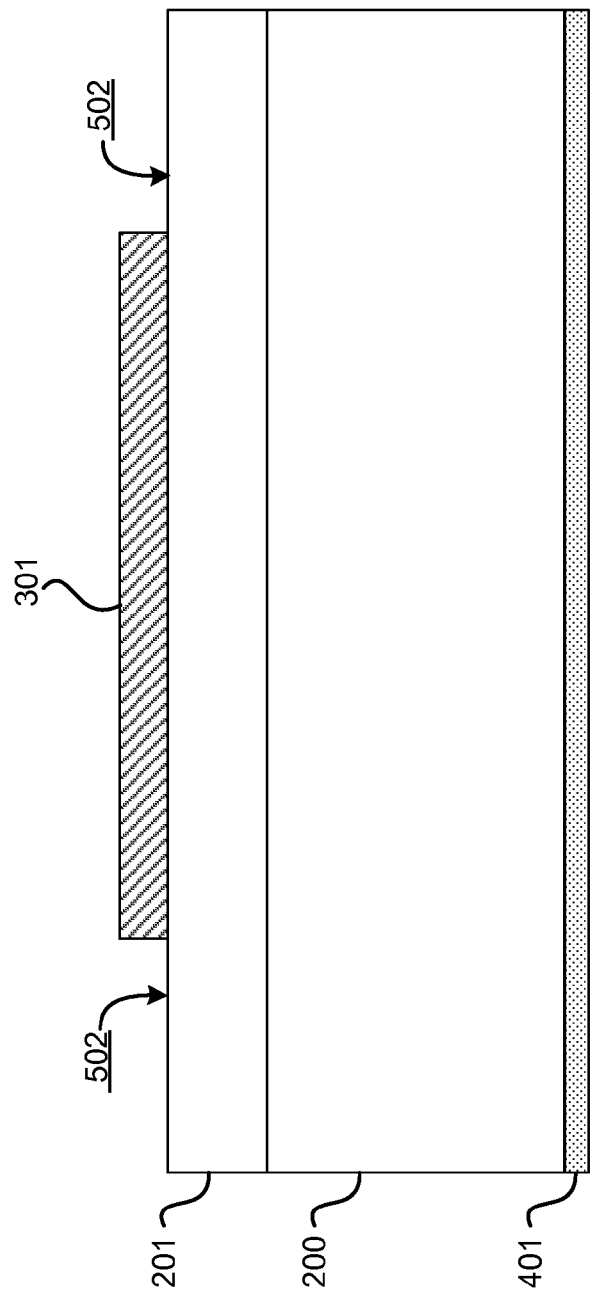

FIG. 5 illustrates the removal at least a portion of the second GaN epitaxial layer 301 to expose one or more surfaces 502 physically adjacent to a remaining portion of the second epitaxial layer 301. The removal can be performed by etching the second GaN epitaxial layer 301 or by using some other suitable removal process. For example, a controlled etch using an etch mask (not shown but having the width of the remaining portion of the second epitaxial layer 301) can be used, designed to stop at approximately the interface between the second GaN epitaxial layer 301 and the first GaN epitaxial layer 201. Other embodiments may include stopping the etch at other depths, such as after the etch has removed a portion of the first GaN epitaxial layer 201. Inductively-coupled plasma (ICP) etching and/or other common GaN etching processes can be used.

In other embodiments, second GaN epitaxial layer 301 may be formed by selective epitaxial regrowth. For example, a masking material that inhibits the epitaxial growth of GaN may be formed on surfaces 502 prior to the formation of second GaN epitaxial layer 301. When second GaN epitaxial layer 301 is grown, it will not grow on the masking material (e.g. silicon dioxide or silicon nitride). The masking material may then be removed, leaving the structure shown in FIG. 5.

Figure 6:
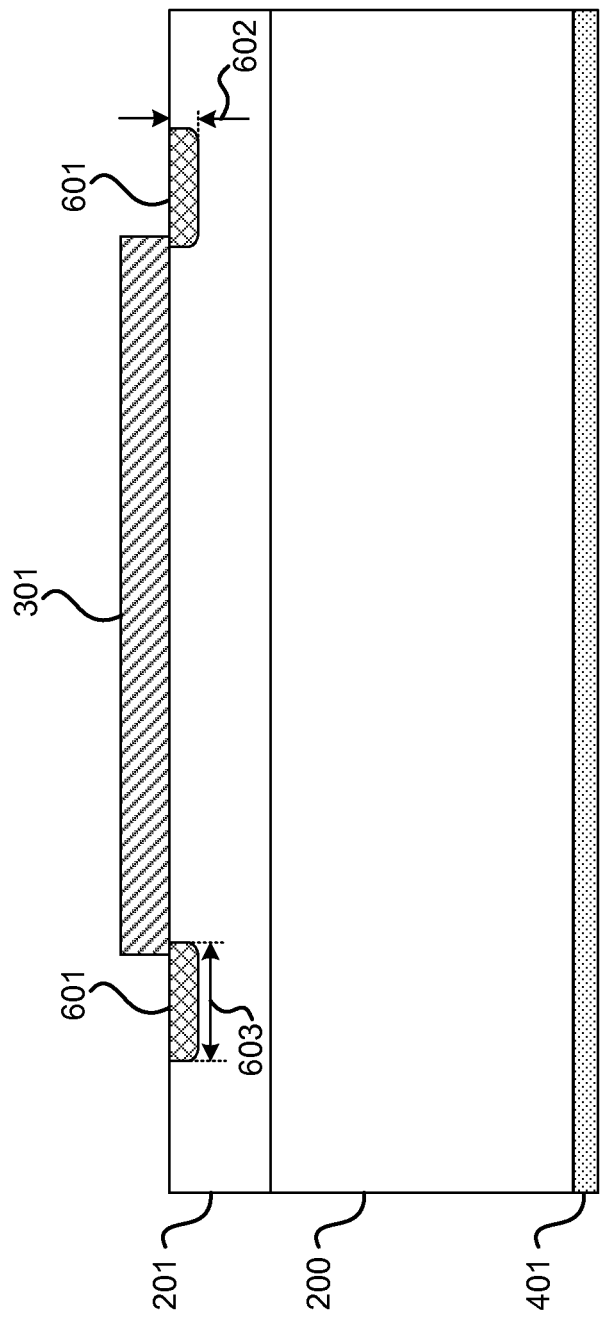

FIG. 6 is a simplified cross-sectional diagram illustrating ion implantation into a portion of the first GaN epitaxial layer 201 to form one or more isolation implanted region(s) 601 that can be utilized as edge termination structures. Depending on desired functionality, the isolation implanted region(s) 601 can be formed with various shapes and depths to provide proper edge termination for the active device. For a P-i-N diode, for example, the isolation implanted region(s) 601 can be located at each edge of the junction between p-type and intrinsic semiconductor layers, thereby circumscribing the active region of the P-i-N diode.

The ion implantation can be performed through mask openings formed in a layer of photoresist, silicon dioxide, or other suitable masking materials. In one embodiment, the same mask that was used to expose surfaces 502 may also be used to mask the ion implantation. In other embodiments, a metal contact layer coupled to the remaining portion of the second GaN epitaxial layer 301 (see, e.g., metal structure 701 of FIG. 7), can serve as a mask for ion implantation. As indicated in FIG. 6, lateral spreading can occur in the ion implantation process, which can cause a portion of the isolation implanted region(s) 601 to spread laterally under second GaN epitaxial layer 301, in between portions of the first GaN epitaxial layer 201 and the second GaN epitaxial layer 301. Such lateral spreading can increase the effectiveness of edge termination provided by the isolation implanted region(s) 601.

The ion implantation process illustrated in FIG. 6 used to form isolation implanted region(s) 601 is designed to dramatically reduce the electrical charge (free holes, free electrons, electrically active ionized donor or acceptor atoms) and the conductivity of the implanted region(s) (in relation to adjacent portions of the first III-nitride epitaxial material). Reducing or eliminating the free charge in this region means that, when the diode is reverse-biased, fewer or none of the electric field lines originating in second GaN epitaxial layer 301 can terminate in this implanted region. These electric field lines must therefore terminate in the underlying portion of first GaN epitaxial layer 201.

As described elsewhere herein, the conductivity of the epitaxial layer(s) can be modified using an ion implantation process to reduce the conductivity with respect to the unimplanted state. The conductivity of the epitaxial layer will depend, in part, on the active dopants or charge in the epitaxial layer times the thickness of the layer (i.e., the integrated charge in the layer). The ion implantation processes used herein implant ionic species to increase the resistivity (i.e., decrease the conductivity) of predetermined portions of the epitaxial layer, which can provide a spatial variation or modulation in the conductivity. Without limiting embodiments of the present invention, the inventors believe that the implantation process reduces the conductivity by at least one of the following mechanisms: compensating for dopants, annihilating dopants, increasing vacancy density, increasing void density, decreasing the total net charge in the epitaxial layer, decreasing the density of ionized acceptors (donors for n-type material), some or all of which may provide for increased resistivity. Throughout the specification, reference is made to decreased conductivity or increased resistivity, which can also be referred to as a decrease in active charge, a decrease in active dopant species, a decrease in charge density, or the like. Due to the robust nature of GaN-based materials, ion implantation can produce implanted ions interspersed with unchanged epitaxial material, effectively reducing the conductivity in an averaged sense, with voids or vacancies interspersed in the lattice with as-grown epitaxial material. The present invention is not limited by the physical mechanism resulting in the spatial conductivity modulation.

Utilizing embodiments of the present invention, it is possible to provide a charge density in the implanted region that is substantially lower than a charge density in the surrounding epitaxial layer. According to one embodiment, for example, the charge density in the implanted region is reduced by at least 90%. According to other embodiments, the charge density in the implanted region is reduced by at least 95% or at least 99%.

This causes the depletion region in the first GaN epitaxial layer 201 (formed by the junction between the remaining portion of the second GaN epitaxial layer 301 and the first GaN epitaxial layer 201) to be pushed away from the edge of the remaining portion of the second GaN epitaxial layer 301, reducing the effects of edge field crowding. The critical electric field (i.e. magnitude of electric field at which avalanche breakdown occurs) may also be significantly higher within implanted region 601 in comparison to other portions of the first GaN epitaxial layer 201, which may further increase the breakdown voltage of the P-i-N diode.

The implanted ion species may be argon, nitrogen, helium, hydrogen, or other appropriate species at doping concentrations to dramatically reduce the conductivity of the resulting isolation implanted region(s) 601. Multiple implantations may be performed through the same mask opening, each implant being performed at a different energy, such that the implanted profiles extend deeper vertically, without a need to diffuse the dopants using a high temperature drive-in process. Thus, although the implanted regions are illustrated as a homogeneous material in FIG. 6, this is not required by the present invention and the implant dose can vary as a function of the thickness of the second GaN epitaxial layer as well as in the plane of the layer.

In one embodiment, implanted region(s) 601 may comprise three nitrogen implantations performed with first, second, and third implantation energies of about 20 to 60 keV, about 100 to 200 keV, and about 300 to 500 keV, respectively. These nitrogen implant doses may be in the range of $5 \times 10^{12}$ to $1 \times 10^{16}$ cm$^{-2}$. In another embodiment, a single argon implant may be used with energy of 20 to 100 keV and a dose in the range of $1 \times 10^{12}$ to $5 \times 10^{16}$ cm$^{-2}$. After the ion implantation process(es), an optional high-temperature anneal may be performed to activate the implanted ions and/or repair damage in the III-nitride material which may be introduced by the ion implantation.

The physical dimensions of the isolation implanted region(s) 601 can vary, depending on desired functionality. In some embodiments, for example, the depth 602 of the isolation implanted region(s) 601 can be 0.1 μm to 1 μm or greater. Furthermore, according to some embodiments, the width 603 of the isolation implanted region(s) 601 can be 0.5 μm to 10 μm or greater. In yet other embodiments, one or more portions of the second GaN epitaxial layer 301 also may be implanted during ion implantation.

Figure 7:
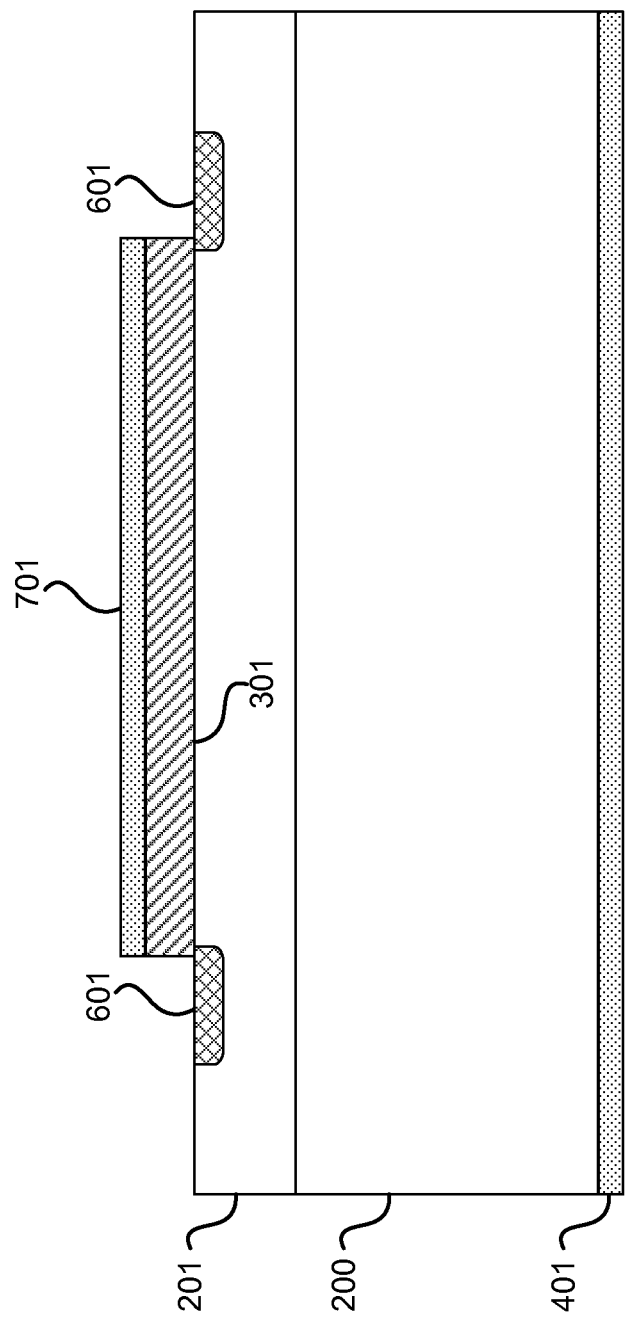

FIG. 7 illustrates the formation of a metal structure 701 coupled to the second GaN epitaxial layer 301. This metal structure 701, can provide an anode Ohmic metal contact to the P-i-N diode, and may be formed using one or more metals such as palladium, platinum, nickel, and the like. As described above, in certain embodiments the metal structure 701 may be formed before the formation of the isolation implanted region(s) 601 and may serve as a mask during an ion implantation process used to form the isolation implanted region(s) 601. Metal structure 701 may be formed of different materials than those used to form metal structure 401. For example, the materials used for second metallic structure 701 may be selected to optimize the Ohmic contact to the p-type material second epitaxial layer 301, while the materials used for metal structure 401 may be selected to optimize the Ohmic contact to substrate 200. After metal structure 701 is formed, an optional heat treatment may be performed to improve the characteristics of the metal and/or the contact between the metal and region 301. For example, an RTA may be performed with a temperature in the range of 300° C. to 900° C. for a duration of one to ten minutes. In some embodiments, the ambient environment during the RTA may include nitrogen, hydrogen, oxygen, or a combination of these gases.

Although some embodiments provided herein are discussed in terms of GaN substrates and GaN epitaxial layers, the present invention is not limited to these particular binary III-V materials and is applicable to a broader class of III-V materials, in particular III-nitride materials. Additionally, although a GaN substrate 200 is illustrated in FIG. 2, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

Some embodiments provided in relation to the fabrication process illustrated in FIGS. 2-7 were discussed in terms of having an n-type drift layer grown on an n-type substrate. However, the present invention is not limited to this particular configuration. In other embodiments, substrates with p-type doping are utilized. Additionally, embodiments can use materials having an opposite conductivity type to provide devices with different functionality. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

Additionally, although described in relation to the fabrication of a P-i-N diode, the techniques provided herein for the formation of edge termination region can be applied to a variety of structures including, but not limited to, PN diodes, Schottky barrier diodes, vertical junction field-effect transistors (JFETs), thyristors, bipolar transistors, and other semiconductor devices.

Figure 8:
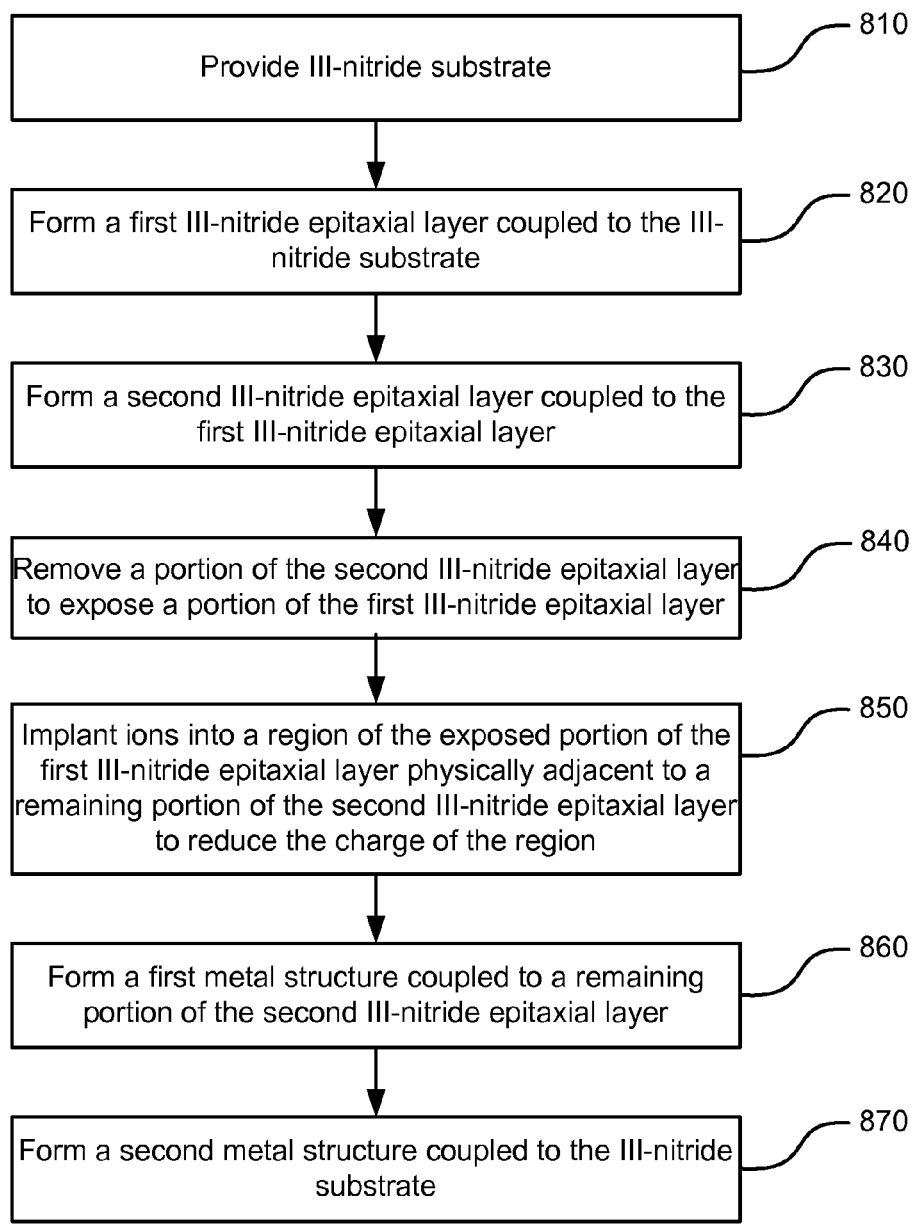
FIG. 8 is a simplified flowchart illustrating a method of fabricating a III-nitride semiconductor device with an edge implanted regions for edge termination according to an embodiment of the present invention.

FIG. 8 is a simplified flowchart illustrating a method of fabricating a III-nitride semiconductor device having edge termination region, according to an embodiment of the present invention. Referring to FIG. 8, a III-nitride substrate is provided (810). In an embodiment, the III-nitride is a GaN substrate with n+ conductivity type. The method also includes forming a first III-nitride epitaxial layer (e.g., an n-type GaN epitaxial layer) coupled to the III-nitride substrate (820). In some embodiments, such as those in which a P-i-N diode is the semiconductor device formed, the III-nitride substrate and first III-nitride epitaxial layer are characterized by a first conductivity type, for example n-type conductivity. Additionally, in some embodiments, the III-nitride substrate can have a dopant concentration greater than a dopant concentration of the first III-nitride epitaxial layer. Using homoepitaxy techniques, the thickness of the III-nitride epitaxial layer can be greater than available using conventional techniques, for example, between about 1 μm and about 100 μm.

The method further includes forming a second III-nitride epitaxial layer coupled to the first III-nitride epitaxial layer (830). As indicated earlier, the second III-nitride epitaxial layer can have an opposite conductivity type than the first III-nitride epitaxial layer and III-nitride substrate. Where the first III-nitride epitaxial layer is an n– GaN epitaxial layer, for example, the second III-nitride epitaxial layer may be a p-type GaN epitaxial layer.

The method further includes removing a portion of the second III-nitride epitaxial layer to expose a portion of the first III-nitride epitaxial layer (840). This allows for subsequent ion implantation near the edge of the active region of the III-nitride device to provide edge termination. As indicated previously, the removal process can include a variety of processes, such as etching. The physical dimension of the portions removed by the removal process can vary, depending on a variety of factors (e.g., dimensions of the subsequently formed edge termination regions, operation voltage, etc.), as will be appreciated by one of ordinary skill in the art.

The method further includes implanting ions into a region of the exposed portion of the first III-nitride epitaxial layer physically adjacent to a remaining portion of the second III-nitride epitaxial layer to reduce the charge of the region (850). The reduced charge in the region expands the depletion region near the edge of the active region of the III-nitride device, creating an edge termination region that mitigates edge field crowding effects that would reduce the breakdown voltage of the III-nitride device.

A first metal structure is coupled to a remaining portion of the second III-nitride epitaxial layer (860) to form a first electrical contact to the III-nitride device. As stated earlier, some embodiments may include forming the first metal structure before implanting ions into the region of the exposed portion of the first III-nitride epitaxial layer in order to use the first metal structure as a mask during the ion implantation process. A second metal structure is coupled to the III-nitride substrate (870) to form a second electrical contact to the III-nitride device.

It should be appreciated that the specific steps illustrated in FIG. 8 provide a particular method of fabricating a III-nitride semiconductor device with implanted regions for edge termination according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 9:
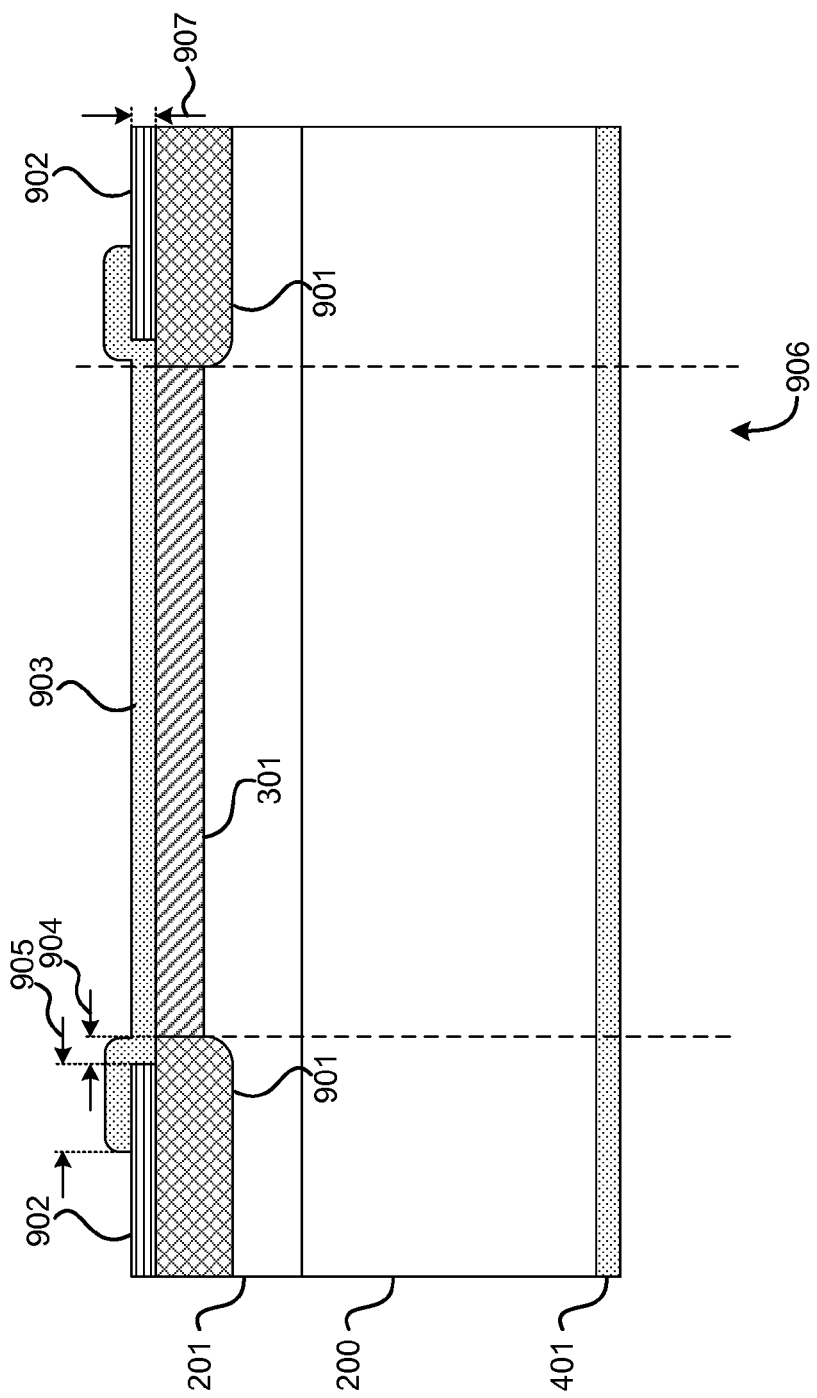
FIG. 9 is a simplified cross-sectional diagram illustrating an embodiment of the present invention utilizing a field plate.

FIG. 9 is a cross-sectional diagram illustrating another embodiment of a P-i-N diode in GaN with an implanted region for edge termination. Many of the features of the embodiment of FIG. 9 are similar to the embodiment shown in relation to FIGS. 2-7. Similarly, the additional features provided in the embodiment of FIG. 9 may be applied to provide edge termination for semiconductor devices other than a P-i-N diode.

Rather than remove portions of the second GaN epitaxial layer 301 to provide for direct ion implantation of the first GaN epitaxial layer 201, the embodiment of FIG. 9 illustrates how isolation implanted region(s) 901 can be made by implanting portions of the second GaN epitaxial layer. The isolation implanted regions(s) 901 penetrates vertically to at least the thickness of the second GaN epitaxial layer 301 and extends into the first GaN epitaxial layer 201. Such implanted region(s) 901 can provide edge termination for the active region 906 of the P-i-N diode. Because the depth of the isolation implanted regions(s) 901 can be greater than the depth 602 of the implanted region(s) 601 of the embodiment of FIGS. 2-7, the formation of isolation implanted regions(s) 901 of the embodiment of FIG. 9 can require more energy. Because the lateral extent of the implant straggle tends to increase with increasing energy, this embodiment may have the advantage of more lateral overlap of the implanted region(s) 901 and second GaN epitaxial layer 301. Isolation implanted region(s) 901 is designed to dramatically reduce the electrical charge (free holes, free electrons, electrically active ionized donor or acceptor atoms) and the conductivity of the implanted region in both second GaN epitaxial layer 301 (providing lateral isolation for the P-i-N diode) and in first GaN epitaxial layer 201 (providing the same breakdown voltage benefit described in reference to FIG. 6, above).

As illustrated in FIG. 9, a field plate may also be utilized in the embodiment of FIG. 9 to increase the effectiveness of the edge termination. The field plate can comprise a portion of a metal structure 903 coupled to the second GaN epitaxial layer 301 that extends laterally beyond the active region 906 and can contact both the implanted region(s) 901 and a dielectric layer 902. The composition and formation of the metal structure 903 can be similar to other Ohmic metal structures discussed herein. The dielectric layer 902 can comprise, for example, benzocyclobutene (BCB), spin-on glass (SOG), $Si_3N_4$, $SiO_2$, etc., combinations thereof, or the like. The thickness 907 of the dielectric layer 902 can vary, depending on the application. According to some embodiments, the thickness 907 of the dielectric layer 902 is between 0.1 μm and 2 μm. According to one embodiment, for example, the thickness 907 is 0.3 μm.

The metal structure 903 may extend laterally over the isolation implanted regions(s) 901 for a distance 904 before contacting the dielectric layer 902. This distance 904 can vary depending on application, but generally can be 0.5 μm to 10 μm or greater. Additionally, the distance 905 of lateral overlap of the metal structure 903 with the dielectric layer 902 can vary. According to some embodiments, the distance 905 is greater than 1 μm. According to one embodiment, for example, the distance 905 is 5 μm. One of ordinary skill in the art would recognize many variations, modifications, and alternatives.

In another embodiment, the dielectric layer 902 may be eliminated, and the metal structure 903 may extend over a portion of the implanted region(s) 901. In yet other embodiments, the dielectric layer 902 may be replaced with an insulating layer such as unintentionally doped GaN, aluminum nitride, aluminum gallium nitride, or the like. Here, unintentionally doped GaN can include a GaN lay with net background or other dopant levels of approximately $1 \times 10^{14}$ $cm^{-3}$ to $1 \times 10^{15}$ $cm^{-3}$. In one embodiment, this insulating layer may be grown in-situ when the first GaN epitaxial layer 201 and second GaN epitaxial layer 301 are formed, providing very high quality material with excellent interface between the second GaN epitaxial layer 301 and the overlying insulating material. This insulating material may be masked and etched to expose the active portion of the second GaN epitaxial layer 301 prior to formation of the metal structure 903.

Figure 10:
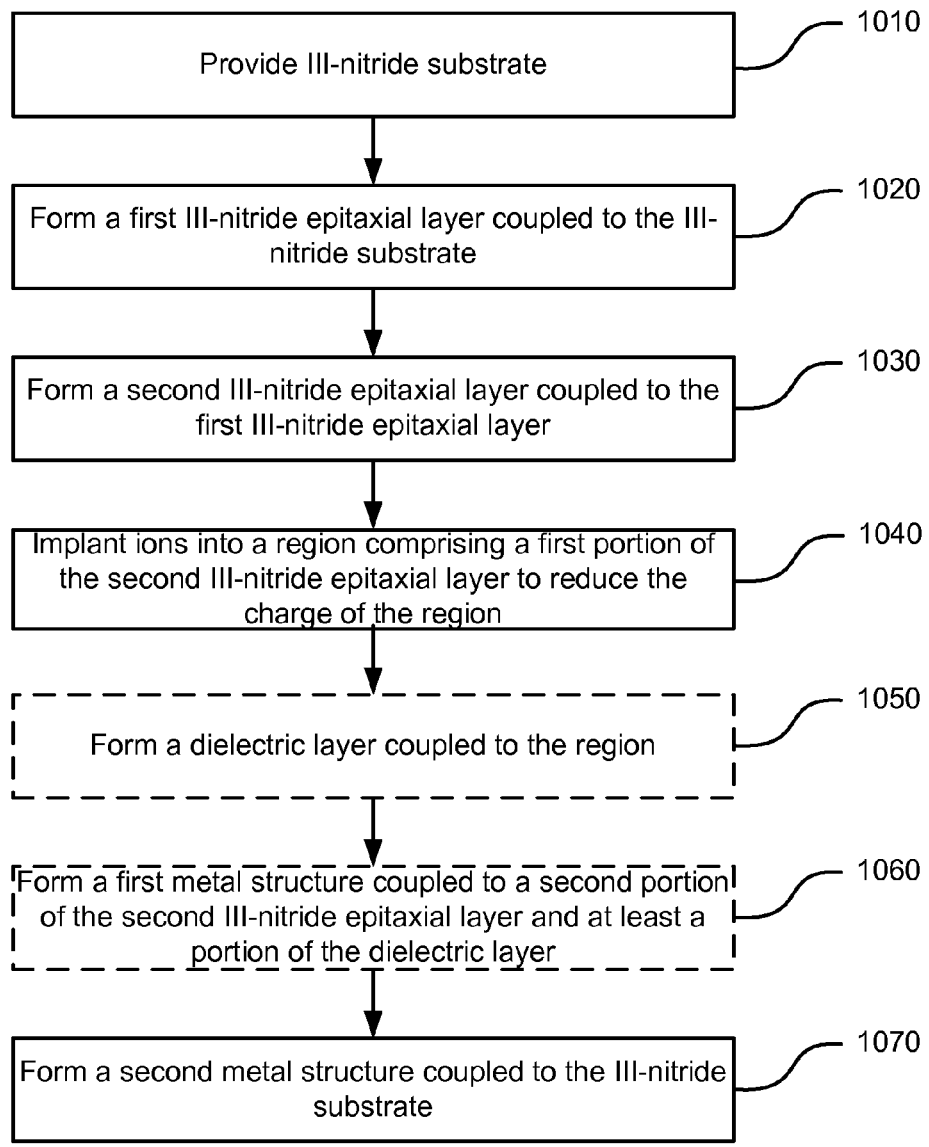
FIG. 10 is a simplified flowchart illustrating a method of fabricating a III-nitride semiconductor device with an edge termination structure and an optional field plate according to an embodiment of the present invention.

FIG. 10 is a simplified flowchart illustrating method of fabricating a III-nitride semiconductor device having edge termination region and a field plate, similar to the embodiment shown in FIG. 9. As shown by blocks 1010-1030, the method of FIG. 10 is similar to the method of FIG. 8 in some aspects. The method of FIG. 10, however, provides for ion implantation into a region comprising a first portion of the second III-nitride epitaxial layer to reduce the charge of the region (1040), and, if a field plate is to be formed, forming a dielectric layer coupled to the region (1050). Also, optionally, a metal contact and field plate can be formed by forming a first metal structure coupled to a second portion of the second III-nitride epitaxial layer and at least a portion of the dielectric layer (1060). As shown in FIG. 9, the first metal structure also may be coupled to a portion of the region. Otherwise, if a field plate is not to be formed, the first metal structure may be coupled only to the second portion of the second III-nitride epitaxial layer. As stated above, the usage of a field plate in combination with ion-implanted edge termination regions can enhance the edge-termination effectiveness of the III-nitride semiconductor device. Usage of a field plate, however, is optional. A second metal structure also can be coupled to the III-nitride substrate (1070) to provide an electrical contact to the III-nitride semiconductor device.

It should be appreciated that the specific steps illustrated in FIG. 10 provide a particular method of fabricating a III-nitride semiconductor device with implanted regions for edge termination and an optional field plate according to an embodiment of the present invention. Other sequences of steps may also be performed according to alternative embodiments. For example, alternative embodiments of the present invention may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A III-nitride semiconductor device, comprising:
a III-nitride substrate of a first conductivity type;
a first III-nitride epitaxial layer of the first conductivity type coupled to the III-nitride substrate, wherein the first III-nitride epitaxial layer is characterized by a first charge density;
a second III-nitride epitaxial layer of a second conductivity type coupled to the first III-nitride epitaxial layer; and
an implanted region in the first III-nitride epitaxial layer, wherein the implanted region of the first III-nitride epitaxial layer is of the first conductivity type, wherein the implanted region of the first III-nitride epitaxial layer is characterized by a second charge density, and wherein the second charge density is lower than the first charge density.

2. The device of claim 1, wherein the first III-nitride epitaxial layer comprises an n-type GaN epitaxial material.

3. The device of claim 1, wherein the depth of the implanted region is between 0.1 µm and 1 µm.

4. The device of claim 1, wherein a width of the implanted region is 0.5 µm or greater.

5. The device of claim 1, wherein the III-nitride semiconductor device is characterized by a breakdown voltage of 600V or greater.

6. The device of claim 5, wherein a thickness of the first III-nitride epitaxial layer is between 1µm and 100 µm.

7. The device of claim 1, further comprising a dielectric layer coupled to the implanted region.

8. The device of claim 7, further comprising a first metal structure coupled to at least a portion of the dielectric layer.

9. The device of claim 8, wherein the first metal structure is further coupled to a portion of the implanted region.

10. The device of claim 8, further comprising a second metal structure coupled to the III-nitride substrate.

11. A III-nitride P-i-N diode, comprising:
a III-nitride substrate of a first conductivity type, wherein the III-nitride substrate forms one of either a cathode or an anode of the P-i-N diode;
a first III-nitride epitaxial layer of the first conductivity type coupled to the III-nitride substrate, wherein the first III-nitride epitaxial layer is characterized by a first charge density;
a second III-nitride epitaxial layer of a second conductivity type coupled to the first III-nitride epitaxial layer, wherein the second III-nitride epitaxial layer forms the other of either the cathode or the anode of the P-i-N diode; and
an implanted region in the first III-nitride epitaxial layer, wherein the implanted region of the first III-nitride epitaxial layer is of the first conductivity type, wherein the implanted region of the first III-nitride epitaxial layer is characterized by a second charge density, and wherein the second charge density is lower than the first charge density.

12. The device of claim 11, wherein the first III-nitride epitaxial layer comprises an n-type GaN epitaxial material.

13. The device of claim 11, wherein the depth of the implanted region is between 0.1 µm and 1 m.

14. The device of claim 11, wherein a width of the implanted region is 0.5 µm or greater.

15. The device of claim 11, wherein the III-nitride semiconductor device is characterized by a breakdown voltage of 600V or greater.

16. The device of claim 15, wherein a thickness of the first III-nitride epitaxial layer is between 1 µm and 100 µm.

17. The device of claim 11, further comprising a dielectric layer coupled to the implanted region.

18. The device of claim 17, further comprising a first metal structure coupled to at least a portion of the dielectric layer.

19. The device of claim 18, wherein the first metal structure is further coupled to a portion of the implanted region.

20. The device of claim 18, further comprising a second metal structure coupled to the III-nitride substrate.

* * * * *